US012777724B2

(12) United States Patent
Chung et al.

(10) Patent No.: US 12,777,724 B2
(45) Date of Patent: Oct. 27, 2026

(54) ARRAY SUBSTRATE AND MANUFACTURING METHOD THEREOF

(71) Applicant: Infovision Optoelectronics (Kunshan) Co., LTD., Suzhou City (CN)

(72) Inventors: Te-Chen Chung, Suzhou City (CN); Huilong Zheng, Suzhou City (CN); Xingang Wang, Suzhou City (CN)

(73) Assignee: INFOVISION OPTOELECTRONICS (KUNSHAN) CO., LTD., Suzhou City (CN)

( * ) Notice: Subject to any disclaimer, the term of this patent is extended or adjusted under 35 U.S.C. 154(b) by 399 days.

(21) Appl. No.: 18/558,365

(22) PCT Filed: Dec. 23, 2021

(86) PCT No.: PCT/CN2021/140924
§ 371 (c)(1),
(2) Date: Oct. 31, 2023

(87) PCT Pub. No.: WO2023/115471
PCT Pub. Date: Jun. 29, 2023

(65) Prior Publication Data
US 2024/0222397 A1 Jul. 4, 2024

(51) Int. Cl.
*H10D 86/60* (2025.01)
*G02F 1/1368* (2006.01)
(Continued)

(52) U.S. Cl.
CPC ........... *H10D 86/60* (2025.01); *G02F 1/1368* (2013.01); *H10D 86/0231* (2025.01);
(Continued)

(58) Field of Classification Search
CPC ............. H10D 86/0231; H10D 86/441; H10D 86/451; H10D 86/60; H10D 86/423;
(Continued)

(56) References Cited

U.S. PATENT DOCUMENTS 7,202,924 B1 4/2007 Park et al.
2018/0240821 A1* 8/2018 Lu ........................ H10D 86/423
(Continued)

FOREIGN PATENT DOCUMENTS

CN 107845644 A 3/2018
CN 109757118 A 5/2019
(Continued)

OTHER PUBLICATIONS

English translation of CN 113629071, from which Xu (US 2023/0028565) derives foreign priority. (Year: 2021).*

*Primary Examiner* — Zandra V Smith
*Assistant Examiner* — Douglas Yap
(74) *Attorney, Agent, or Firm* — Cheng-Ju Chiang

(57) ABSTRACT

An array substrate and a manufacturing method thereof are provided. The array substrate includes: a substrate; a data line and a first insulation layer which are provided on the substrate; a metal oxide semiconductor layer provided above the first insulation layer, the metal oxide semiconductor layer including a source and a drain which are conductors and an active layer which is a semiconductor; a gate insulation layer provided on the metal oxide semiconductor layer, and a scan line and a gate provided on the gate insulation layer, the projection of the active layer on the substrate coinciding with an overlapping area of the projection of the scan line and the projection of the data line on the substrate, the projection of the gate on the substrate coinciding with the projection of the active layer on the substrate; and a pixel electrode provided above the first insulating layer.

9 Claims, 12 Drawing Sheets

(51) Int. Cl.
*H10D 86/01* (2026.01)
*H10D 86/40* (2025.01)

(52) U.S. Cl.
CPC ......... *H10D 86/451* (2025.01); *H10D 86/423* (2025.01); *H10D 86/441* (2025.01)

(58) Field of Classification Search
CPC ............... G02F 1/1368; G02F 1/13338; G02F 1/13629; G02F 1/136227
See application file for complete search history.

(56) References Cited

U.S. PATENT DOCUMENTS

| | | | | |
|---|---|---|---|---|
| 2019/0146293 | A1* | 5/2019 | Xue | G02F 1/1368 257/72 |
| 2019/0172882 | A1* | 6/2019 | Nam | G02F 1/133308 |
| 2019/0237034 | A1* | 8/2019 | Hao | G09G 3/3614 |
| 2023/0028565 | A1* | 1/2023 | Xu | G02F 1/133345 |

FOREIGN PATENT DOCUMENTS

| | | | |
|---|---|---|---|
| CN | 110297369 | A | 10/2019 |
| CN | 112071882 | A | 12/2020 |
| CN | 113568230 | A | 10/2021 |

* cited by examiner

ARRAY SUBSTRATE AND MANUFACTURING METHOD THEREOF

CROSS REFERENCE TO RELATED APPLICATIONS

This application is a 35 U.S.C. § 371 National Phase conversion of International (PCT) Patent Application No. PCT/CN2021/140924, filed on Dec. 23, 2021, which is incorporated herein by reference in its entirety. The PCT International Patent Application was filed and published in Chinese.

BACKGROUND OF THE APPLICATION

Field of the Application

The present application relates to the field of display technology, and in particular, to an array substrate and a manufacturing method thereof.

Description of Related Art

With the development of display technology, thin and light display panels are very popular among consumers, especially thin and light display panels (LCD).

An existing display device includes a thin film transistor array substrate (TFT array substrate), a color filter substrate (CF substrate) and liquid crystal molecules filled between the TFT array substrate and the CF substrate. When the above display device is in operation, driving voltages are applied to the pixel electrode of the TFT array substrate and the common electrode of the CF substrate respectively, or driving voltages are applied to the common electrode and the pixel electrode of the TFT array substrate respectively, to control the rotation direction of the liquid crystal molecules between the two substrates, so as to refract the backlight provided by a backlight module of the display device, thereby displaying the pictures.

The display panel usually needs to be attached with a touch panel to achieve touch operation. In order to reduce the thickness of the display panel, the touch electrode is usually placed at the inner surface of the display panel in the prior art, thus forming an in-cell touch display panel. In order to reduce the manufacturing process, the touch lines are usually made of the same layer of metal as the data lines and set side by side, but the side by side setting will reduce the opening ratio of the pixels.

The oxide thin film transistor (TFT) in the prior art has advantages of excellent electrical performance, large area manufacturing uniformity and low manufacturing cost, and is expected to be applied in various flat panel display products. However, the gate of the existing array substrate is usually located under the active layer, such that the active layer is vulnerable to the influence of external ambient light, resulting in the characteristics degradation of the TFT device. Therefore, a light shielding layer needs to be set above the active layer to avoid the characteristics degradation of the TFT device caused by the oxide active layer being illuminated. A small number of gates are disposed on the active layer, but the active layer is vulnerable to the influence of the backlight module, resulting in the characteristics degradation of the TFT device. Therefore, a light shielding layer needs to be set below the active layer to avoid the characteristics degradation of the TFT device caused by the oxide active layer being illuminated.

In the prior art, no matter whether the gate is disposed above or below the active layer, a light shielding layer needs to be set to avoid the characteristics degradation of the TFT device caused by the active layer being illuminated. The light shielding layer needs a separate etching process, specifically including film forming, photolithography, etching, debonding and cleaning to realize patterning. The process steps are relatively complex. Moreover, the overlapping area between the gate and the source/drain of the existing array substrate is relatively large, and thus the parasitic capacitance of the TFT device is also large. The overlapping area between the gate and the source/drain determines the parasitic capacitance of the TFT device, and the overlapping area is determined by the alignment of the engraving, so the parasitic capacitance is difficult to be reduced.

BRIEF SUMMARY OF THE APPLICATION

In order to overcome the shortcomings and deficiencies in the prior art, the object of the present application is to provide an array substrate and a manufacturing method thereof, so as to solve the problems of complex manufacturing process and large parasitic capacitance generated between the gate and the source/drain in the prior art.

The object of the present application is realized by the following technical solutions:

The present application provides an array substrate, which includes:

- a substrate;
- a first metal layer disposed on an upper surface of the substrate, wherein the first metal layer includes a data line;
- a first insulating layer disposed on an upper surface of the first metal layer, wherein the first insulating layer covers the data line;
- a metal oxide semiconductor layer disposed above the first insulating layer, wherein the metal oxide semiconductor layer includes a source and a drain which are conductors and an active layer which is a semiconductor, the drain and the source are connected through the active layer, the source is electrically connected with the data line;
- a gate insulating layer disposed on the metal oxide semiconductor layer and a second metal layer disposed on the gate insulating layer, wherein the second metal layer includes a scan line and a gate electrically connected with the scan line, the projection of the active layer on the substrate coincides with an overlapping area of the projection of the scan line and the projection of the data line on the substrate, the projection of the gate on the substrate coincides with the projection of the active layer on the substrate;
- a pixel electrode disposed above the first insulating layer, wherein the pixel electrode is electrically connected with the drain.

Further, the array substrate further includes a third insulating layer disposed on the second metal layer and a transparent conductive layer disposed on the third insulating layer, the third insulating layer covers the scan line and the gate, the transparent conductive layer includes a plurality of common electrode blocks, and the common electrode block is insulated from the pixel electrode.

Further, the transparent conductive layer further includes a second connecting block, and the data line is electrically connected with the source through the second connecting block.

Further, the array substrate further includes a touch metal layer disposed on the first insulating layer, the touch metal layer includes a touch line, the projection of the touch line on the substrate coincides with the projection of the data line on the substrate, an extension direction of the touch line is parallel to an extension direction of the data line, and each common electrode block is electrically connected with a corresponding touch line.

Further, the touch metal layer is arranged between the first insulating layer and the metal oxide semiconductor layer, a second insulating layer is arranged between the touch metal layer and the metal oxide semiconductor layer, the touch metal layer further includes a first connecting block, and the data line is electrically connected with the source through the first connecting block.

Further, the touch metal layer is arranged between the first insulating layer and the metal oxide semiconductor layer, a second insulating layer is arranged between the touch metal layer and the metal oxide semiconductor layer, the touch metal layer further includes a first connecting block, the transparent conductive layer further includes a second connecting block, and the data line is electrically connected with the source through the first connecting block and the second connecting block.

Further, the transparent conductive layer further includes the pixel electrode, and both the common electrode block and the pixel electrode are of comb-like structures that are matched with each other; or the metal oxide semiconductor layer is made of transparent metal oxide semiconductor material, the metal oxide semiconductor layer further includes the pixel electrode which is a conductor, and the pixel electrode is directly connected with the drain.

The present application further provides a manufacturing method of an array substrate, the manufacturing method is configured for manufacturing the array substrate as described above, and the manufacturing method includes:

providing a substrate;

forming a first metal layer on the substrate, and etching the first metal layer, such that the first metal layer is patterned to form a data line;

forming a first insulating layer covering the data line on an upper surface of the first metal layer;

forming a metal oxide semiconductor layer above the first insulating layer, and etching the metal oxide semiconductor layer, such that the metal oxide semiconductor layer is patterned to form a source, a drain and an active layer, wherein the source and the drain are electrically connected through the active layer, the source is electrically connected with the data line;

forming a gate insulating layer and a second metal layer on the metal oxide semiconductor layer in sequence, forming a layer of photoresist on an upper surface of the second metal layer, and etching the second metal layer, such that the second metal layer is patterned to form a scan line and a gate electrically connected with the scan line;

using the second metal layer or the photoresist as a shelter to perform a conducting treatment to the metal oxide semiconductor layer, such that the source and the drain of the metal oxide semiconductor layer are made conductive, while the active layer of the metal oxide semiconductor layer remains as a semiconductor, the projection of the active layer on the substrate coincides with an overlapping area of the projection of the scan line and the projection of the data line on the substrate, the projection of the gate on the substrate coincides with the projection of the active layer on the substrate;

removing the photoresist on the upper surface of the second metal layer;

forming a pixel electrode above the first insulating layer, wherein the pixel electrode is electrically connected with the drain.

Further, the manufacturing method further includes:

forming a third insulating layer and a transparent conductive layer on the second metal layer in sequence, and etching the transparent conductive layer, such that the transparent conductive layer is patterned to form a plurality of common electrode blocks, and the common electrode block is insulated from the pixel electrode.

Further, the transparent conductive layer further includes a second connecting block, and the data line is electrically connected with the source through the second connecting block.

Further, the manufacturing method further includes: forming a touch metal layer on the first insulating layer, and etching the touch metal layer, such that the touch metal layer is patterned to form a touch line, the projection of the touch line on the substrate coincides with the projection of the data line on the substrate, an extension direction of the touch line is parallel to an extension direction of the data line, and each common electrode block is electrically connected with a corresponding touch line.

Further, the touch metal layer is arranged between the first insulating layer and the metal oxide semiconductor layer, a second insulating layer is arranged between the touch metal layer and the metal oxide semiconducting layer, the touch metal layer further includes a first connecting block, and the data line is electrically connected with the source through the first connecting block.

Further, the touch metal layer is arranged between the first insulating layer and the metal oxide semiconductor layer, a second insulating layer is arranged between the touch metal layer and the metal oxide semiconducting layer, the touch metal layer further includes a first connecting block, the transparent conductive layer further includes a second connecting block, and the data line is electrically connected with the source through the first connecting block and the second connecting block.

Further, the metal oxide semiconductor layer is made of transparent metal oxide semiconductor material, when the metal oxide semiconductor layer is etched, the metal oxide semiconductor layer further forms the pixel electrode, when performing the conducting treatment to the metal oxide semiconductor layer, the source, the drain and the pixel electrode of the metal oxide semiconductor layer are made conductive; or when the transparent conductive layer is etched, the transparent conductive layer further forms the pixel electrode, and both the common electrode block and the pixel electrode are of comb-like structures that are matched with each other.

By setting the active layer between the gate and the data line, and the projection of the active layer on the substrate coincides with the overlapping area of the projection of the scan line and the projection of the data line on the substrate, the gate and the data line can respectively shield the external ambient light and the backlight for the active layer, so as to avoid the characteristics degradation of the TFT device caused by the active layer being illuminated, and simplify the manufacturing process due to no need to set an additional light shielding layer. Moreover, the source, the drain and the active layer are all made of metal oxide semiconductor layer, such that the overlapping area between the gate and the source/drain is small, and the parasitic capacitance is reduced.

BRIEF DESCRIPTION OF THE DRAWINGS

FIGS. 4*a*-41 are cross-sectional views when manufacturing the array substrate in the first embodiment of the present application;

FIG. 6 is a cross-sectional view of the array substrate in the second embodiment of the present application;

FIG. 8 is a cross-sectional view of the array substrate in the third embodiment of the present application;

FIG. 9 is a cross-sectional view of the array substrate in the fourth embodiment of the present application;

FIG. 10 is a cross-sectional view of the array substrate in the fifth embodiment of the present application;

FIG. 11 is a cross-sectional view of the array substrate in the sixth embodiment of the present application;

FIG. 12 is a plan view partially showing the array substrate in the sixth embodiment of the present application;

FIG. 13 is a cross-sectional view of the display panel in the present application.

DETAILED DESCRIPTION OF THE APPLICATION

In order to further illustrate the technical solutions and effects of the present application to achieve its intended purpose, the following describes the specific implementation mode, structures, features and effects of the array substrate and its manufacturing method and the display panel provided by the present application in combination with the drawings and preferred embodiments as follows.

First Embodiment

Figure 1:
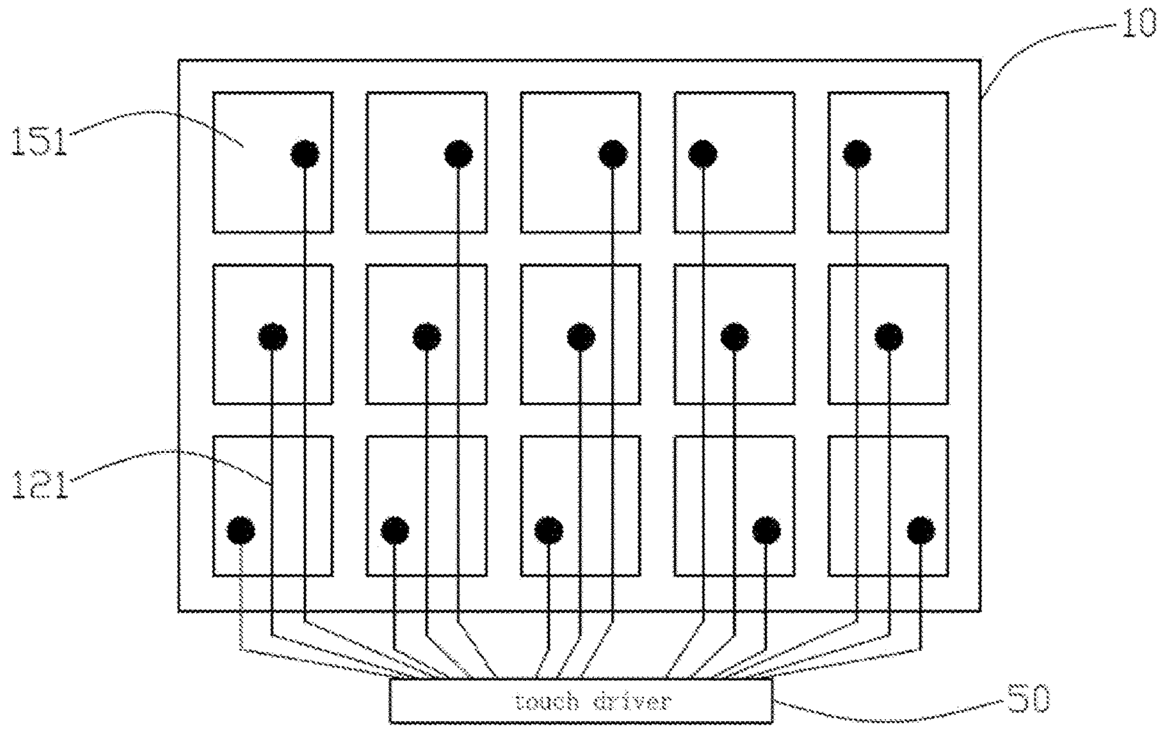
FIG. 1 is a plan view of the array substrate in the first embodiment of the present application.
Figure 2:
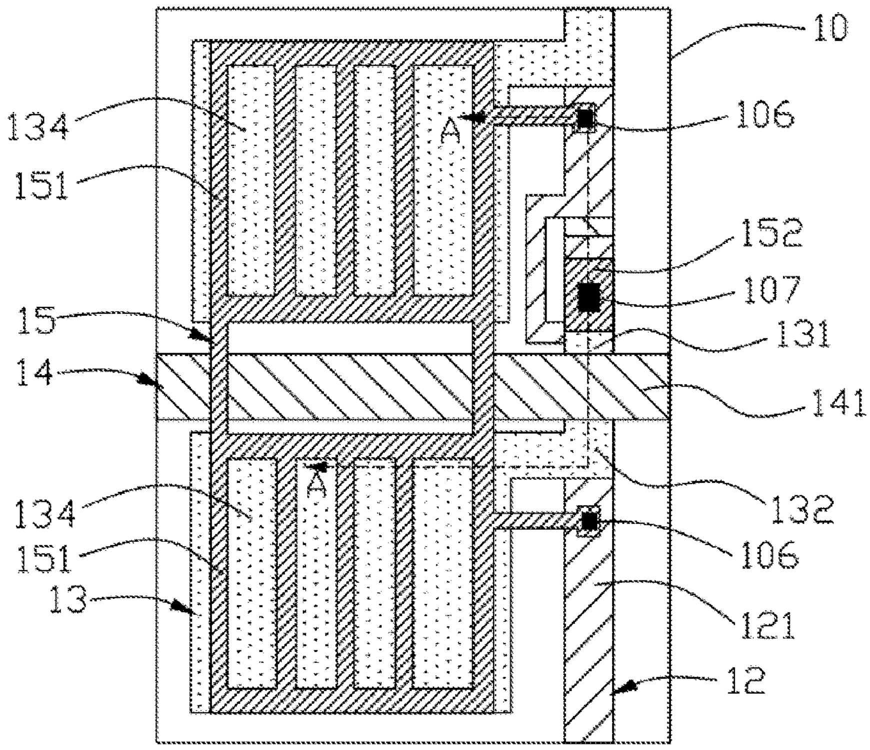
FIG. 2 is a plan view partially showing the array substrate in the first embodiment of the present application.
Figure 3:
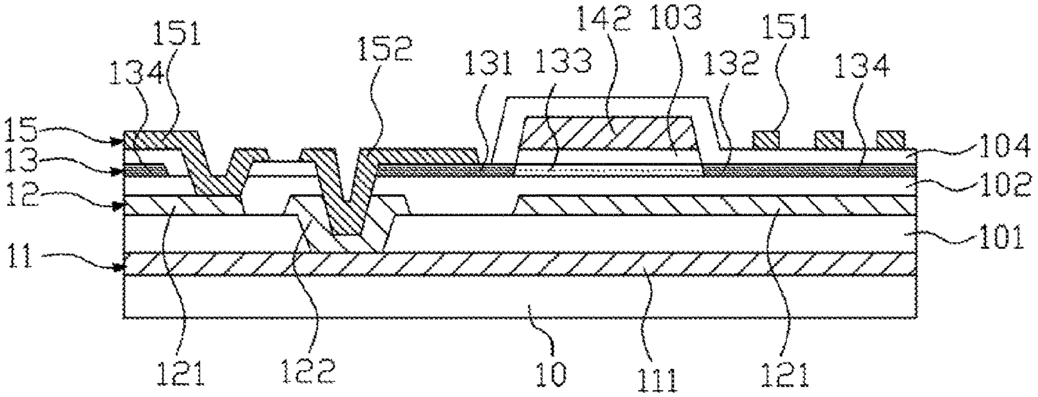
FIG. 3 is a cross-sectional view of the array substrate along line A-A in FIG. 2 of the present application.

FIG. 1 is a plan view of the array substrate in the first embodiment of the present application, FIG. 2 is a plan view partially showing the array substrate in the first embodiment of the present application, FIG. 3 is a cross-sectional view of the array substrate along line A-A in FIG. 2 of the present application, FIGS. 4*a*-41 are cross-sectional views when manufacturing the array substrate in the first embodiment of the present application, FIGS. 5*a*-5*f* are plan views when manufacturing the array substrate in the first embodiment of the present application.

As shown in FIGS. 1 to 5*f*, an array substrate provided in the first embodiment of the present application includes:

- a substrate 10, wherein the substrate 10 can be made of glass, quartz, silicon, acrylic acid, polycarbonate, etc., and the substrate 10 can also be a flexible substrate. Suitable materials for the flexible substrate include, for example, polyethersulfone (PES), polyethylene naphthalate (PEN), polyethylene (PE), polyimide (PI), polyvinyl chloride (PVC), polyethylene terephthalate (PET), or a combination thereof.
- a first metal layer 11 disposed on the substrate 10. Preferably, the first metal layer 11 is directly disposed on the upper surface of the substrate 10. The first metal layer 11 includes a data line 111. Specifically, the first metal layer 11 can be made of metals such as copper (Cu), silver (Ag), chromium (Cr), molybdenum (Mo), aluminum (Al), titanium (Ti), manganese (Mn), nickel (Ni), etc., or a combination of the above metals such as Al/Mo, Cu/Mo, etc.
- a first insulating layer 101 disposed on the first metal layer 11. Preferably, the first insulating layer 101 is directly disposed on the upper surface of the first metal layer 11. The first insulating layer 101 covers the data line 111. In this embodiment, the first insulating layer 101 is provided with a first contact hole 105 (FIG. 4*b*) at the position corresponding to data line 111, and the data line 111 is exposed from the first contact hole 105. Specifically, the material of the first insulating layer 101 is silicon oxide (SiOx), silicon nitride (SiNx) or a combination of the two. The first insulating layer 101 may also be replaced by an overcoat layer (OC). Preferably, a transparent metal oxide layer, such as indium tin oxide (ITO), indium zinc oxide (IZO), etc., can be arranged between the first metal layer 11 and the first insulating layer 101. When the first insulating layer 101 is made of an overcoat layer (OC), corrosion of the first metal layer 11 can be prevented.
- a touch metal layer 12 disposed on the first insulating layer 101. Preferably, the touch metal layer 12 is directly disposed on the upper surface of the first insulating layer 101. The touch metal layer 12 includes a touch line 121, the projection of the touch line 121 on the substrate 10 coincides with the projection of the data line 111 on the substrate 10, and the extension direction of the touch line 121 is parallel to the extension direction of the data line 111, that is, the touch line 121 is located directly above the data line 111, thereby increasing the opening ratio of the pixel units. In this embodiment, the touch metal layer 12 further includes a first connecting block 122, the first connecting block 122 and the touch line 121 are insulated and separated from each other, and the first connecting block 122 contacts the upper surface of the data line 111 through the first contact hole 105. Specifically, the projection of the first connecting block 122 on the substrate 10 coincides with the projection of the data line 111 on the substrate 10. In order to avoid the first connecting block 122, the touch line 121 is provided with a connecting section 1211 (FIG. 5*b*) on one side of the first connecting block 122, and the connecting section 1211 connects the two parts of the touch line 121 located above and below the first connecting block 122. Specifically, the touch metal layer 12 can be made of metals such as copper (Cu), silver (Ag), chromium (Cr), molybdenum (Mo), aluminum (Al), titanium (Ti), manganese (Mn), nickel (Ni), etc., or a combination of the above metals such as Al/Mo, Cu/Mo, etc.
- a second insulating layer 102 disposed on the touch metal layer 12. Preferably, the second insulating layer 102 is directly disposed on the upper surface of the touch metal layer 12. The second insulating layer 102 covers the first connecting block 122 and the touch line 121. The material of the second insulating layer 102 is silicon oxide (SiOx), silicon nitride (SiNx) or a combination of the two.
- a metal oxide semiconductor layer 13 disposed on the second insulating layer 102. Preferably, the metal oxide semiconductor layer 13 is directly disposed on the upper surface of the second insulating layer 102. The metal oxide semiconductor layer 13 includes a source 131 and a drain 132 which are conductors and an active layer 133 which is a semiconductor, that is, the metal oxide semiconductor layer 13 includes a conductor part and a semiconductor part, the conductor part includes the source 131 and the drain 132, and the semiconductor part includes the active layer 133. Specifically, some areas of the metal oxide semiconductor layer 13 can be made conductive by performing a conducting treatment to the metal oxide semiconductor layer 13, such as, through plasma processing, for example, by ion bombardment, hydrogen (H2) doping, helium (He) doping, argon (Ar) doping, etc., to form the conductive source 131 and the conductive drain 132, but the active layer 133 is not conductive and remains as a semiconductor. The source 131 and the drain 132 are electrically connected through the active layer 133. In this embodiment, the projection of the source 131, the drain 132 and the active layer 133 on the substrate 10 coincides with the projection of the touch line 121 on the substrate 10.

Further, the metal oxide semiconductor layer 13 also includes a pixel electrode 134 which is conductive, that is, the conductor part of the metal oxide semiconductor layer 13 further includes the pixel electrode 134, that is, when performing the conducting treatment to the metal oxide semiconductor layer 13, a conductive pixel electrode 134 is formed in addition to the conductive source 131 and the conductive drain 132. The pixel electrode 134 is electrically connected with the drain 132. The metal oxide semiconductor layer 13 is preferably made of transparent metal oxide semiconductor materials, such as indium zinc oxide (InZnO), indium gallium oxide (InGaO), indium tin oxide (InSnO), zinc tin oxide (ZnSnO), gallium tin oxide (GaSnO), gallium zinc oxide (GaZnO), indium gallium zinc oxide (IGZO) or indium gallium zinc tin oxide (IGZTO), etc.

a gate insulating layer 103 disposed on the metal oxide semiconductor layer 13 and a second metal layer 14 (FIG. 4*e*) disposed on the gate insulating layer 103. Preferably, the gate insulating layer 103 is directly disposed on the upper surface of the metal oxide semiconductor layer 13, and the second metal layer 14 is directly disposed on the upper surface of the gate insulating layer 103. The second metal layer 14 includes a scan line 141 and a gate 142 (FIG. 5*d*) electrically connected with the scan line 141. The extension direction of the scan line 141 is perpendicular to the extension direction of the data line 111. The gate 142 is a part of the scan line 141, and the gate 142 is located at the intersection of the scan line 141 and the data line 111, that is, the part of the scan line 141 overlapping with the data line 111 is taken as the gate 142. The projection of the gate 142 on the substrate 10 coincides with the projection of the active layer 133 on the substrate 10, that is, the gate 142 is overlapped and aligned with the active layer 133. In this embodiment, the gate insulating layer 103 has the same pattern as the scan line 141 and the gate 142, that is, the scan line 141 and the gate 142 are overlapped with the gate insulating layer 103. The gate insulating layer 103 covers the upper surface of the active layer 133, but the source 131, the drain 132 and the pixel electrode 134 are not covered by the gate insulating layer 103. The material of the gate insulating layer 103 is silicon oxide (SiOx), silicon nitride (SiNx) or a combination of the two. The second metal layer 14 can be made of metals such as copper (Cu), silver (Ag), chromium (Cr), molybdenum (Mo), aluminum (Al), titanium (Ti), manganese (Mn), nickel (Ni), etc., or a combination of the above metals such as Al/Mo, Cu/Mo, etc.

a third insulating layer 104 disposed on the second metal layer 14 and a transparent conductive layer 15 disposed on the third insulating layer 104, wherein the third insulating layer 104 covers the scan line 141, the gate 142, the drain 132 and the pixel electrode 134, but the source 131 is not covered by the third insulating layer 104. Preferably, the third insulating layer 104 is directly disposed on the upper surface of the second metal layer 14, and the transparent conductive layer 15 is directly disposed on the upper surface of the third insulating layer 104. The transparent conductive layer 15 includes a plurality of mutually insulated common electrode blocks 151. Each common electrode block 151 is preferably a slit structure, and each common electrode block 151 preferably covers a plurality of adjacent pixel units. The common electrode block 151 and the pixel electrode 134 are mutually insulated by the third insulating layer 104. In this embodiment, a second contact hole 106 (FIG. 4*k*) corresponding to the position of the touch line 121 and a third contact hole 107 (FIG. 4*k*) corresponding to the position of the first connecting block 122 are provided through the second insulating layer 102 and the third insulating layer 104. The upper surface of the touch line 121 is exposed from the second contact hole 106, and the upper surface of the first connecting block 122 is exposed from the third contact hole 107. Each common electrode block 151 contacts the corresponding touch line 121 through the second contact hole 106. One end of the touch line 121 is electrically connected with a touch driver 50, such that the common electrode block 151 is multiplexed as a touch electrode, as shown in FIG. 1. The transparent conductive layer 15 further includes a second connecting block 152. The common electrode block 151 and the second connecting block 152 are insulated and separated from each other. Specifically, the projection of the second connecting block 152 on the substrate 10 coincides with the projection of the data line 111 on the substrate 10. The second connecting block 152 contacts the first connecting block 122 through the third contact hole 107. The second connecting block 152 also covers the source 131, such that the source 131 is electrically connected with the data line 111 through the second connecting block 152 and the first connecting block 122. The material of the third insulating layer 104 is silicon oxide (SiOx), silicon nitride (SiNx) or a combination of the two. The material of the transparent conductive layer 15 is indium tin oxide (ITO), indium zinc oxide (IZO), etc.

In this embodiment, by setting the active layer 133 between the gate 142 and the data line 111, the gate 142 and the data line 111 can respectively shield the active layer 133 from the external ambient light and the backlight, so as to avoid the characteristics degradation of the TFT device caused by the active layer being illuminated, and no additional shielding layer is required, thereby simplifying the manufacturing process. Moreover, the source 131, the drain 132 and the active layer 133 are all made of the metal oxide semiconductor layer 13, such that the overlapping area between the gate 142 and the source 131/drain 132 is small, and the parasitic capacitance is reduced.

As shown in FIGS. 4*a* to 5*f*, this embodiment further provides a manufacturing method for the above array substrate. The manufacturing method includes the following steps.

Figure 4A:
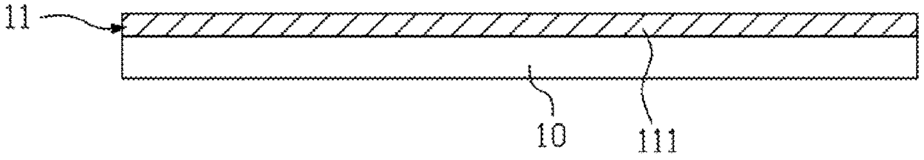
Figure 5A:
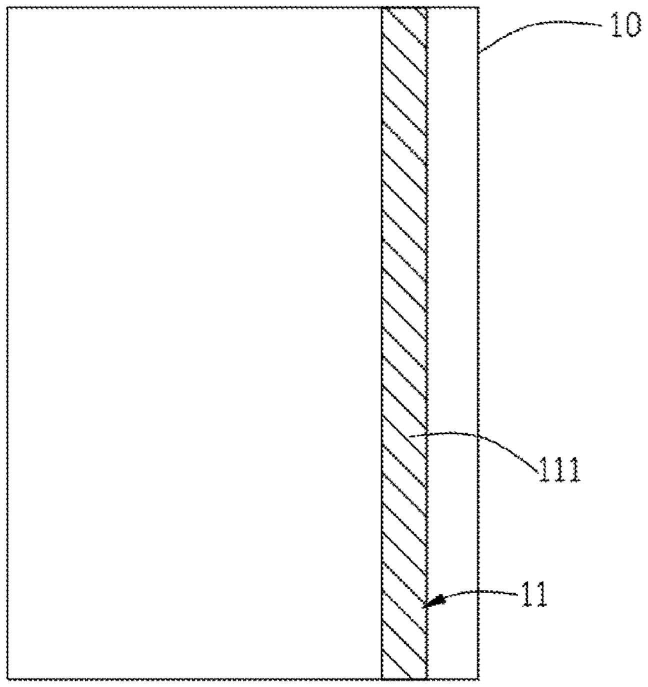
FIGS. 5*a*-5*f* are plan views when manufacturing the array substrate in the first embodiment of the present application.

As shown in FIGS. 4*a* and 5*a*, a substrate 10 is provided. The substrate 10 can be made of glass, quartz, silicon, acrylic acid, polycarbonate, etc., and the substrate 10 can also be a flexible substrate. Suitable materials for the flexible substrate include, for example, polyethersulfone (PES), polyethylene naphthalate (PEN), polyethylene (PE), polyimide (PI), polyvinyl chloride (PVC), polyethylene terephthalate (PET) or a combination thereof.

A first metal layer 11 is formed on the substrate 10. Preferably, the first metal layer 11 is directly formed on the upper surface of the substrate 10. The first metal layer 11 is etched by using a first mask, such that the first metal layer 11 is patterned to form a data line 111. Specifically, the first metal layer 11 can be made of metals such as copper (Cu), silver (Ag), chromium (Cr), molybdenum (Mo), aluminum (Al), titanium (Ti), manganese (Mn), nickel (Ni), etc., or a combination of the above metals such as Al/Mo, Cu/Mo, etc.

Figure 4B:
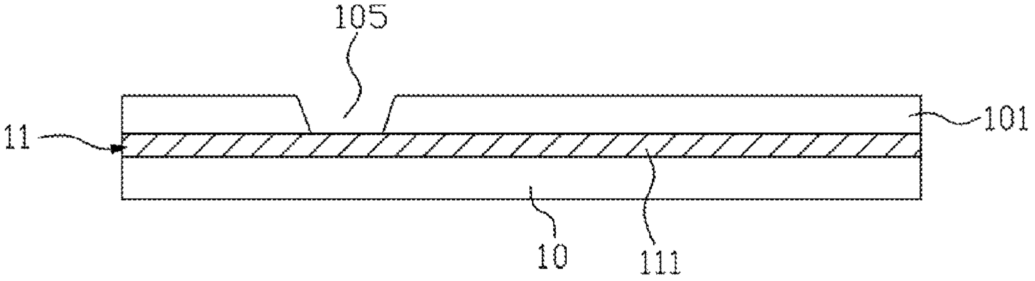

As shown in FIG. 4*b*, a first insulating layer 101 covering the data line 111 is formed on the first metal layer 11. Preferably, the first insulating layer 101 is directly formed on the upper surface of the first metal layer 11. The first insulating layer 101 is etched by using a second mask, such that the first insulating layer 101 forms a first contact hole 105 at the position corresponding to the data line 111, and the data line 111 is exposed from the first contact hole 105. The material of the first insulating layer 101 is silicon oxide (SiOx), silicon nitride (SiNx) or a combination of the two. The first insulating layer 101 may also be replaced by an overcoat layer (OC). Preferably, a transparent metal oxide layer, such as indium tin oxide (ITO), indium zinc oxide (IZO), etc., can be arranged between the first metal layer 11 and the first insulating layer 101. When the first insulating layer 101 is made of an overcoat layer (OC), corrosion of the first metal layer 11 can be prevented.

Figure 4C:
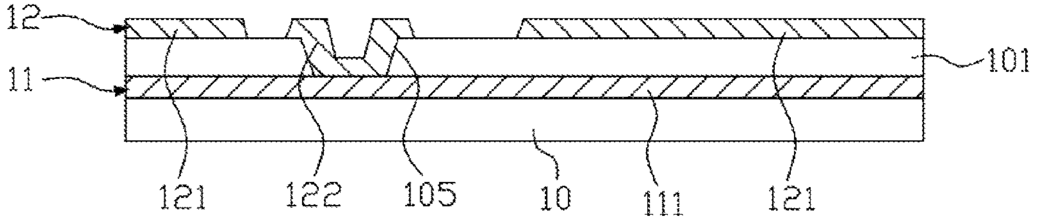
Figure 5B:
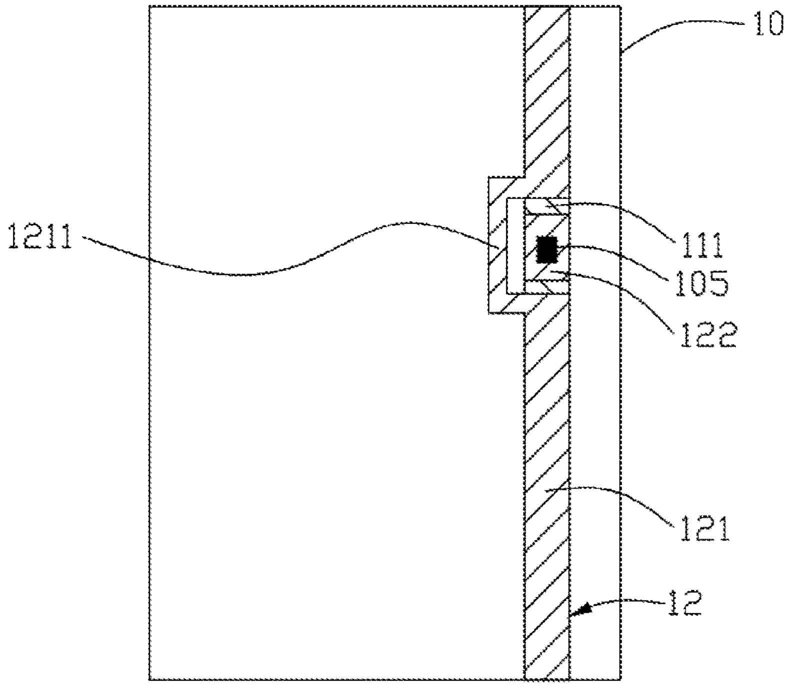

As shown in FIG. 4*c* and FIG. 5*b*, a touch metal layer 12 is formed on the first insulating layer 101. Preferably, the touch metal layer 12 is directly formed on the upper surface of the first insulating layer 101. The touch metal layer 12 is etched by using a third mask, such that the touch metal layer 12 is patterned to form a touch line 121. The projection of the touch line 121 on the substrate 10 coincides with the projection of the data line 111 on the substrate 10, The extension direction of the touch line 121 is parallel to the extension direction of the data line 111, that is, the touch line 121 is located directly above the data line 111, thereby increasing the opening ratio of the pixel units. In this embodiment, the touch metal layer 12 is patterned to further form a first connecting block 122, the first connecting block 122 and the touch line 121 are insulated and separated from each other, and the first connecting block 122 covers the first contact hole 105 and contacts the upper surface of the data line 111. Specifically, the projection of the first connecting block 122 on the substrate 10 coincides with the projection of the data line 111 on the substrate 10. In order to avoid the first connecting block 122, the touch line 121 is provided with a connecting section 1211 on one side of the first connecting block 122, and the connecting section 1211 connects the two parts of the touch line 121 located above and below the first connecting block 122. Specifically, the touch metal layer 12 can be made of metals such as copper (Cu), silver (Ag), chromium (Cr), molybdenum (Mo), aluminum (Al), titanium (Ti), manganese (Mn), nickel (Ni), etc., or a combination of the above metals such as Al/Mo, Cu/Mo, etc.

Figure 4D:
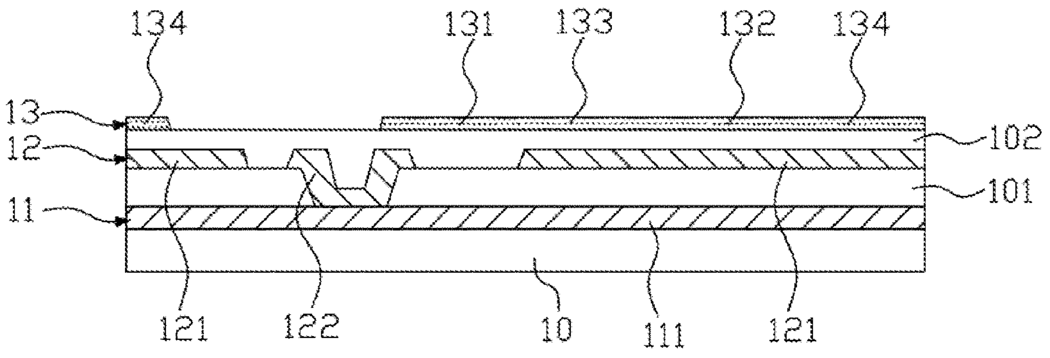
Figure 5C:
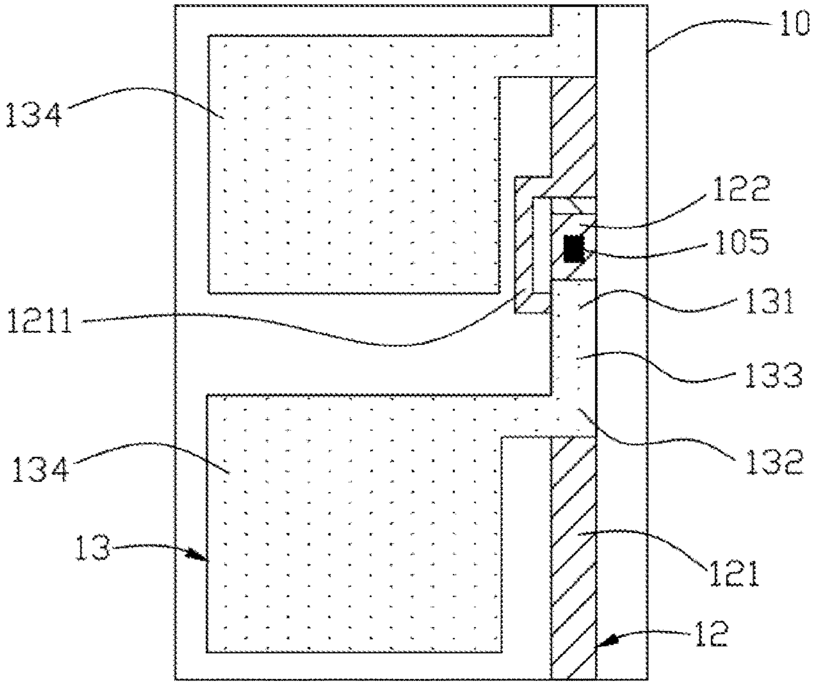

As shown in FIG. 4*d* and FIG. 5*c*, a second insulating layer 102 and a metal oxide semiconductor layer 13 are formed on the touch metal layer 12 in sequence. The second insulating layer 102 covers the first connecting block 122 and the touch line 121. Preferably, the second insulating layer 102 is directly formed on the upper surface of the touch metal layer 12, and the metal oxide semiconductor layer 13 is directly formed on the upper surface of the second insulating layer 102. The metal oxide semiconductor layer 13 is etched by using a fourth mask, such that the metal oxide semiconductor layer 13 is patterned to form a source 131, a drain 132, and an active layer 133. The source 131 and the drain 132 are electrically connected through the active layer 133. In this embodiment, the projection of the source 131, the drain 132 and the active layer 133 on the substrate 10 coincides with the projection of the touch line 121 on the substrate 10.

Further, in etching the metal oxide semiconductor layer 13, the metal oxide semiconductor layer 13 is further patterned to form a pixel electrode 134. The pixel electrode 134 is electrically connected with the drain 132. In addition, the metal oxide semiconductor layer 13 is not covered directly above the first connecting block 122 to facilitate the fabrication and formation of the third contact hole 107. The second insulating layer 102 is made of silicon oxide (SiOx), silicon nitride (SiNx) or a combination of the two. The metal oxide semiconductor layer 13 is preferably made of transparent metal oxide semiconductor materials, such as indium zinc oxide (InZnO), indium gallium oxide (InGaO), indium tin oxide (InSnO), zinc tin oxide (ZnSnO), gallium tin oxide (GaSnO), gallium zinc oxide (GaZnO), indium gallium zinc oxide (IGZO) or indium gallium zinc tin oxide (IGZTO), etc.

As shown in FIGS. 4*e*-4*h* and 5*d*, a gate insulating layer 103 and a second metal layer 14 are formed on the metal oxide semiconductor layer 13 in sequence. Preferably, the gate insulating layer 103 is formed directly on the upper surface of the metal oxide semiconductor layer 13, and the second metal layer 14 is formed directly on the upper surface of the gate insulating layer 103. The second metal layer 14 is etched by using a fifth mask, such that the second metal layer 14 is patterned to form a scan line 141 and a gate 142 electrically connected with the scan line 141. The extension direction of the scan line 141 is perpendicular to the extension direction of the data line 111. The gate 142 is a part of the scan line 141, and the gate 142 is located at the intersection of the scan line 141 and the data line 111, that is, the part of the scan line 141 overlapping with the data line 111 is taken as the gate 142. The projection of the gate 142 on the substrate 10 coincides with the projection of the active layer 133 on the substrate 10, that is, the gate 142 is overlapped and aligned with the active layer 133. The material of the gate insulating layer 103 is silicon oxide (SiOx), silicon nitride (SiNx) or a combination of the two. The second metal layer 14 can be made of metals such as copper (Cu), silver (Ag), chromium (Cr), molybdenum (Mo), aluminum (Al), titanium (Ti), manganese (Mn), nickel (Ni), etc., or a combination of the above metals such as Al/Mo, Cu/Mo, etc.

Figure 4E:
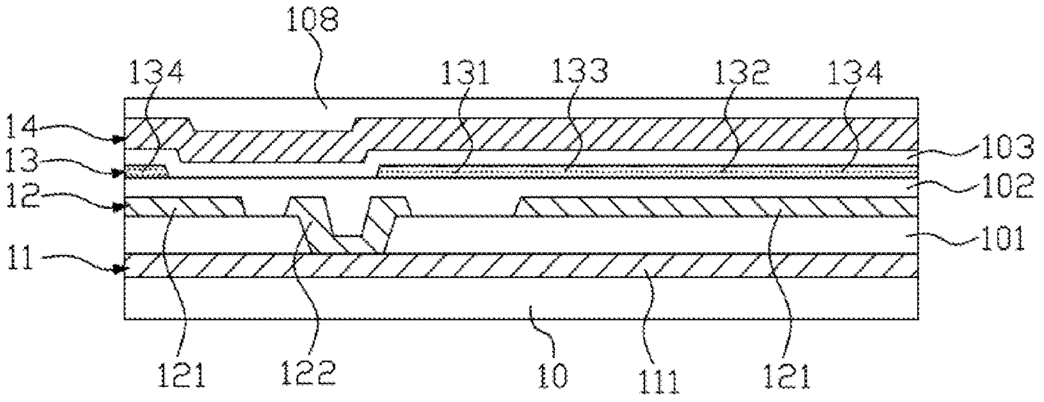
Figure 4F:
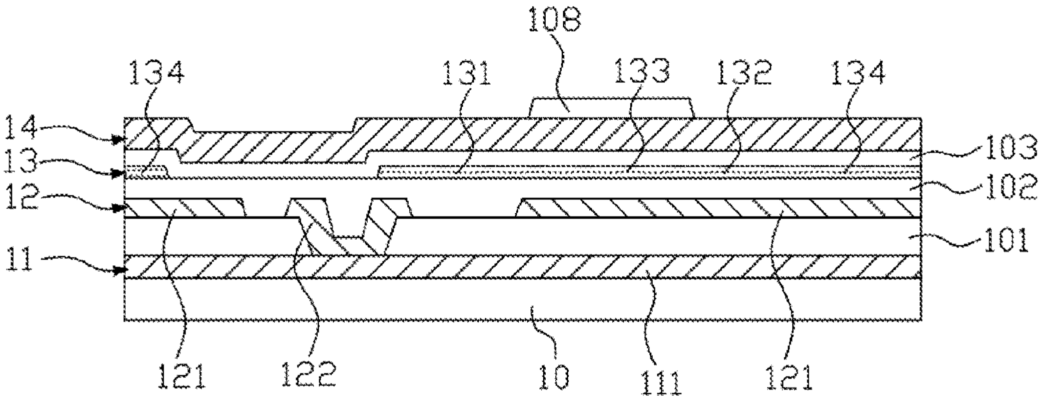
Figure 4G:
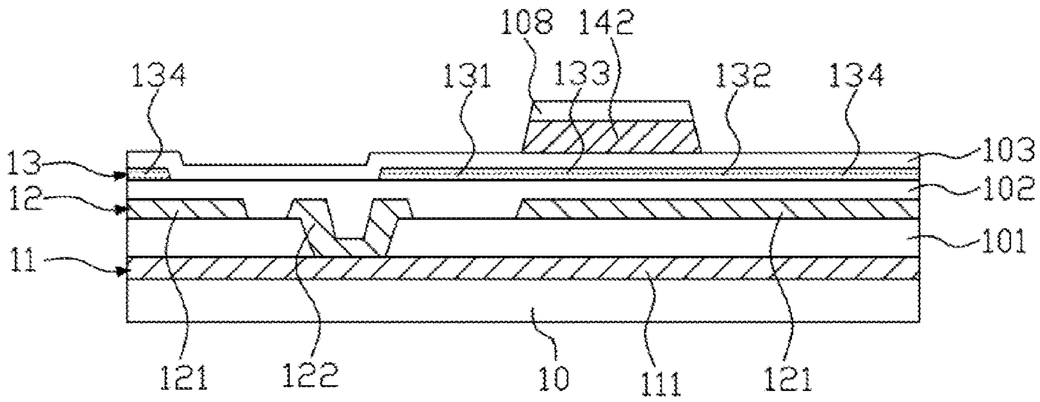
Figure 5D:
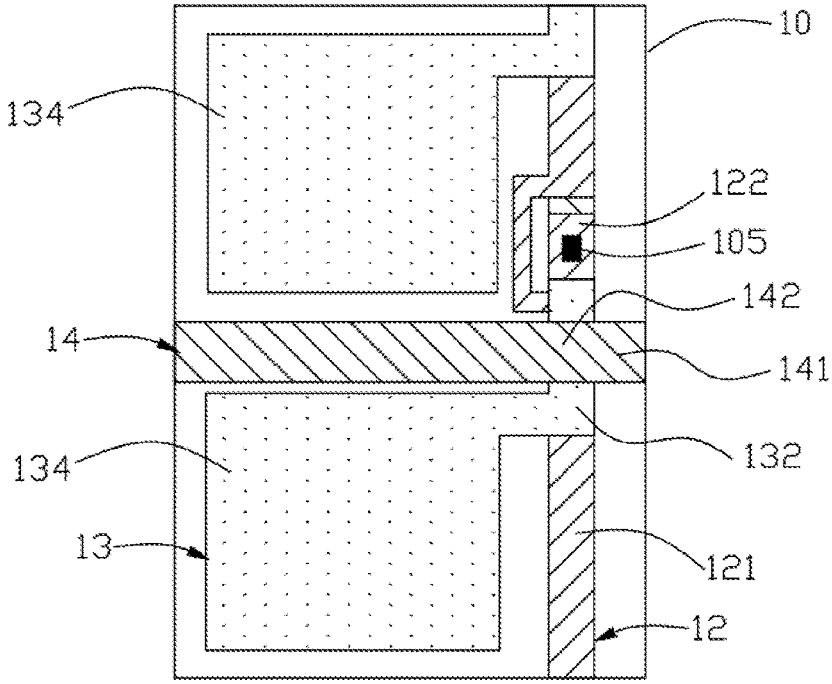

In this embodiment, the specific steps of etching the second metal layer 14 include:

A layer of photoresist 108 is formed on the upper surface of the second metal layer 14, as shown in FIG. 4*e*;

The photoresist 108 is exposed and developed with a mask, as shown in FIG. 4*f*;

The second metal layer 14 is etched under the shelter of the photoresist 108 being left, such that the second metal layer 14 is patterned to form a scan line 141 and a gate 142 electrically connected with the scan line 141, as shown in FIGS. 4*g* and 5*d*. Specifically, the second metal layer 14 can be etched by wet etching.

Figure 4H:
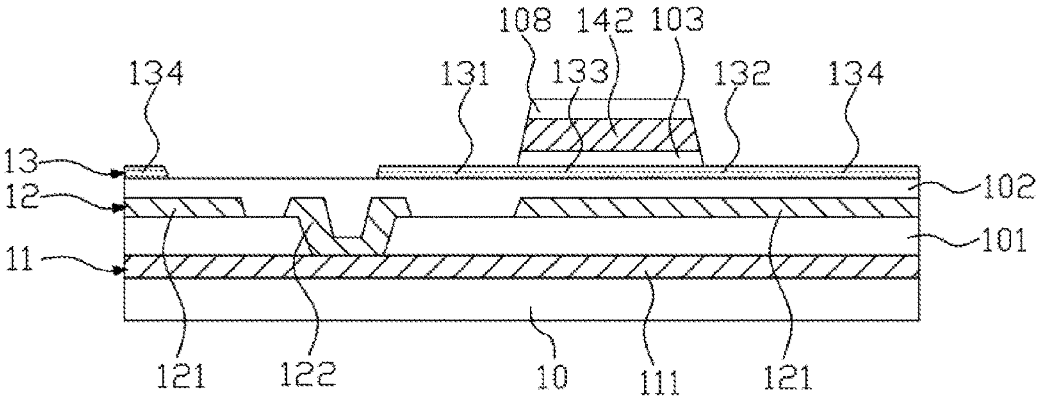

As shown in FIG. 4*h*, the gate insulating layer 103 is then etched under the shelter of the photoresist 108 being left, such that the source 131, the drain 132 and the pixel electrode 134 are exposed, the active layer 133 is covered by the gate insulating layer 103, and the active layer 133 and the gate 142 are separated by the gate insulating layer 103. Specifically, the gate insulating layer 103 can be etched by dry etching. After the gate insulating layer 103 is etched, the gate insulating layer 103 has the same pattern as the scan line 141 and the gate 142, that is, the scan line 141 and the gate 142 are overlapped with the gate insulating layer 103. In this embodiment, the gate insulating layer 103 is etched by using the photoresist 108 being left after the second metal layer 14 is etched as the shelter, such that the gate insulating layer 103 does not need to be etched by using an additional mask, thereby simplifying the manufacturing process. In other embodiments, the photoresist 108 can be removed immediately after the second metal layer 14 is etched, and then the gate insulating layer 103 can be etched by using the second metal layer 14 as the shelter.

Figure 4I:
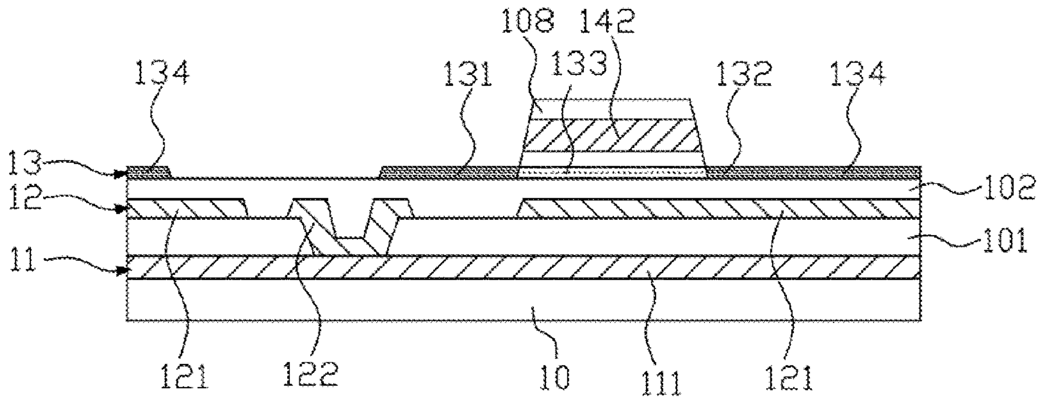
Figure 4J:
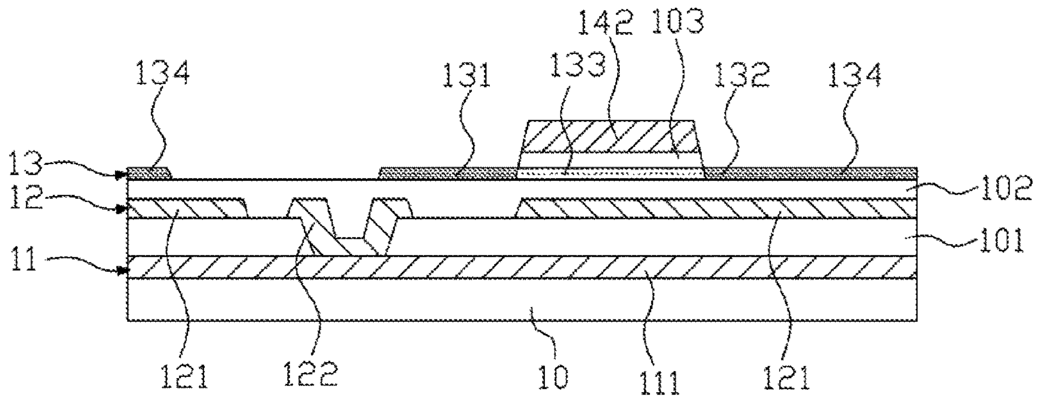
Figure 5E:
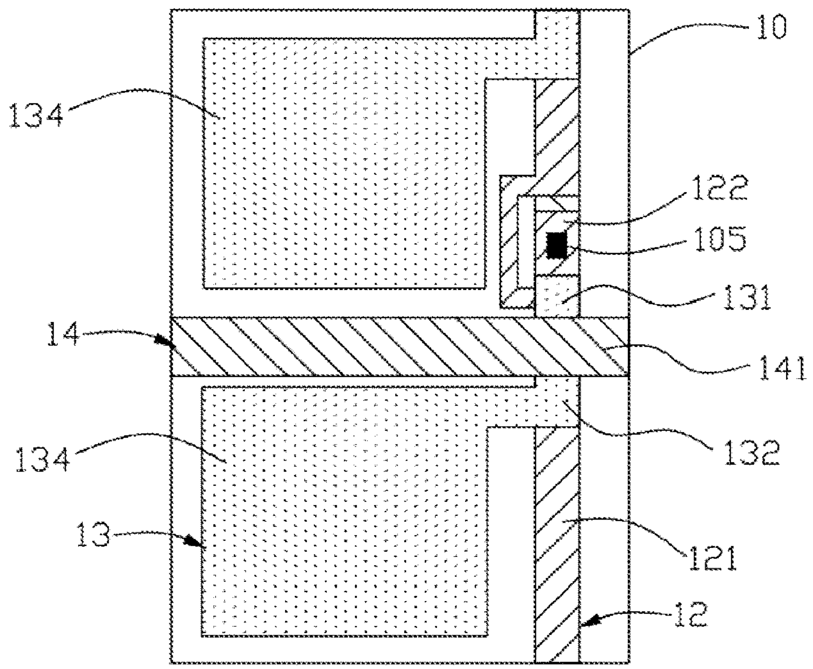
Figure 5F:
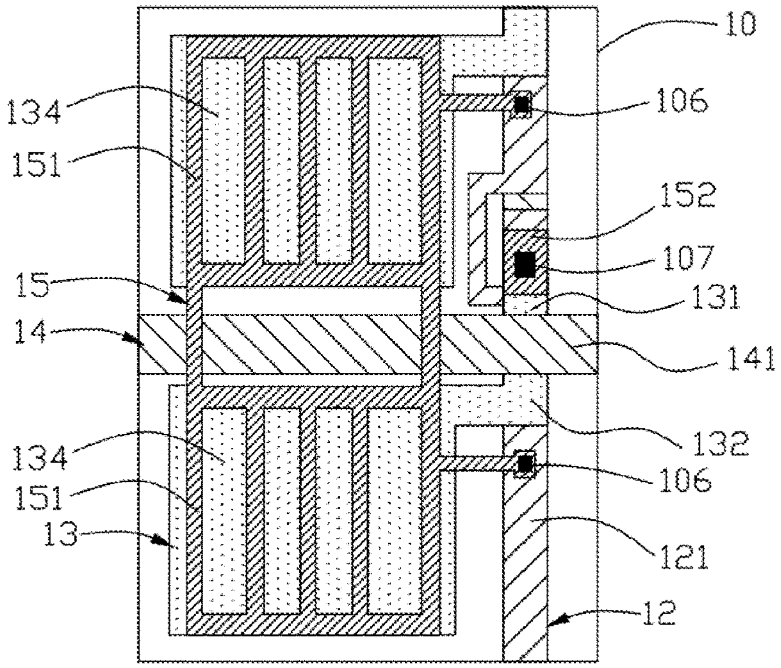

As shown in FIG. 4*i*, FIG. 4*j* and FIG. 5*e*, then a conducting treatment is performed to the exposed area of the metal oxide semiconductor layer 13 under the shelter of the photoresist 108 being left, such that the source 131, the drain 132 and the pixel electrode 134 are made conductive, but the active layer 133 is still retained as a semiconductor due to the shelter of the photoresist 108. Specifically, the method of performing the conducting treatment to the exposed area of the metal oxide semiconductor layer 13 can be plasma processing, for example, by ion bombardment, hydrogen (H2) doping, helium (He) doping, argon (Ar) doping, etc., such that the exposed area of the metal oxide semiconductor layer 13 is made conductive, that is, the source 131, the drain 132 and the pixel electrode 134 are made conductive, as shown in FIG. 4*i*. After performing the conducting treatment to the metal oxide semiconductor layer 13, the photoresist 108 is removed, as shown in FIG. 4*j*. In other embodiments, the photoresist 108 can be removed immediately after the second metal layer 14 is etched, and then the exposed area of the metal oxide semiconductor layer 13 can be made conductive under the shelter of the second metal layer 14, that is, the source 131, the drain 132 and the pixel electrode 134 are made conductive.

Figure 4K:
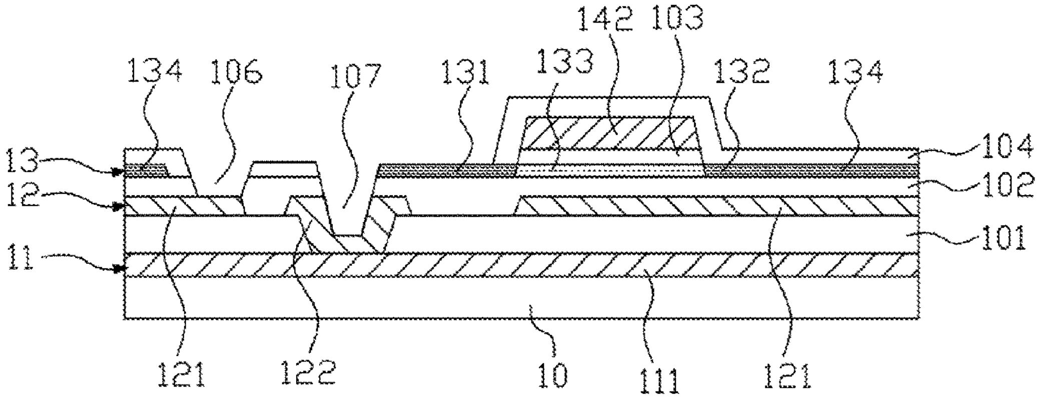

As shown in FIG. 4*k*, a third insulating layer 104 is formed on the second metal layer 14. Preferably, the third insulating layer 104 is formed directly on the upper surface of the second metal layer 14. The third insulating layer 104 and the second insulating layer 102 are etched by using a sixth mask simultaneously, such that a second contact hole 106 corresponding to the position of the touch line 121 and a third contact hole 107 corresponding to the position of the first connecting block 122 are formed through the second insulating layer 102 and the third insulating layer 104. The upper surface of the touch line 121 is exposed from the second contact hole 106, and the upper surface of the first connecting block 122 is exposed from the third contact hole 107. In addition, when the third insulating layer 104 is etched, the part of the third insulating layer 104 located directly above the source 131 is also etched to expose the source 131, while the scan line 141, the gate 142, the drain 132 and the pixel electrode 134 are covered by the third insulating layer 104. The material of the third insulating layer 104 is silicon oxide (SiOx), silicon nitride (SiNx) or a combination of the two.

Figure 4L:
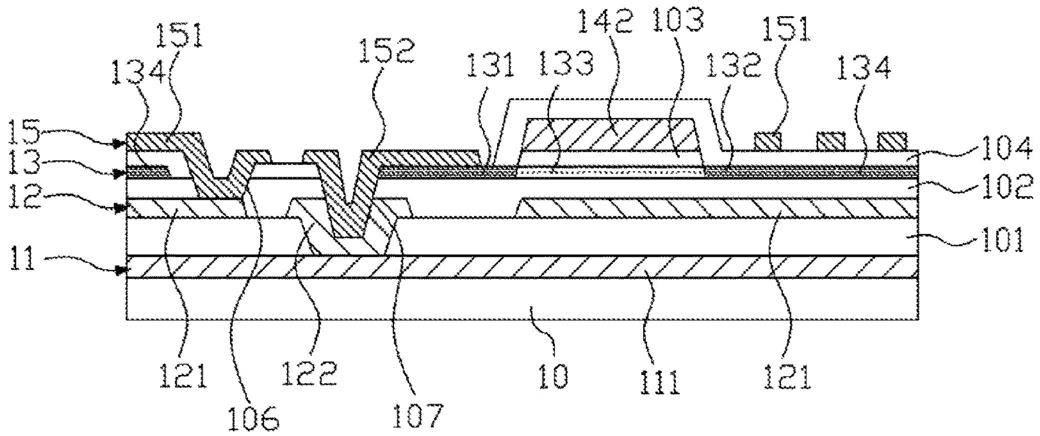

As shown in FIG. 4*l* and FIG. 5*e*, a transparent conductive layer 15 is formed on the third insulating layer 104. Preferably, the transparent conductive layer 15 is formed directly on the upper surface of the third insulating layer 104. The transparent conductive layer 15 is etched by using a seventh mask, such that the transparent conductive layer 15 is patterned to form a plurality of mutually insulated common electrode blocks 151 and a second connecting block 152 corresponding to the first connecting block 122. The common electrode block 151 and the second connecting block 152 are insulated and separated from each other. Specifically, the projection of the second connecting block 152 on the substrate 10 coincides with the projection of the data line 111 on the substrate 10. The common electrode block 151 and the pixel electrode 134 are mutually insulated by the third insulating layer 104. Each common electrode block 151 is preferably a slit structure, and each common electrode block 151 preferably covers a plurality of adjacent pixel units. Each common electrode block 151 contacts the corresponding touch line 121 through the second contact hole 106. One end of the touch line 121 is electrically connected with a touch driver 50, such that the common electrode block 151 is multiplexed as a touch electrode, as shown in FIG. 1. The second connecting block 152 contacts the first connecting block 122 through the third contact hole 107. The second connecting block 152 also covers the source 131, such that the source 131 is electrically connected with the data line 111 through the second connecting block 152 and the first connecting block 122. The material of the transparent conductive layer 15 is indium tin oxide (ITO), indium zinc oxide (IZO), etc.

Second Embodiment

Figure 6:
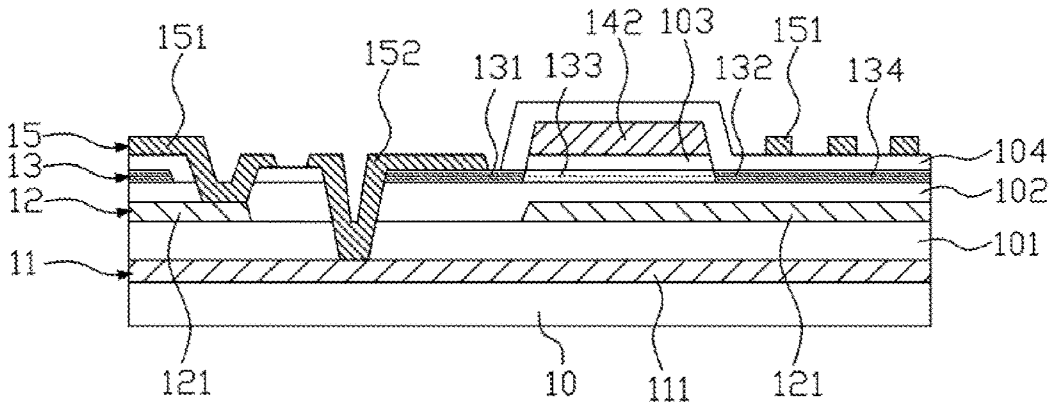
Figure 7A:
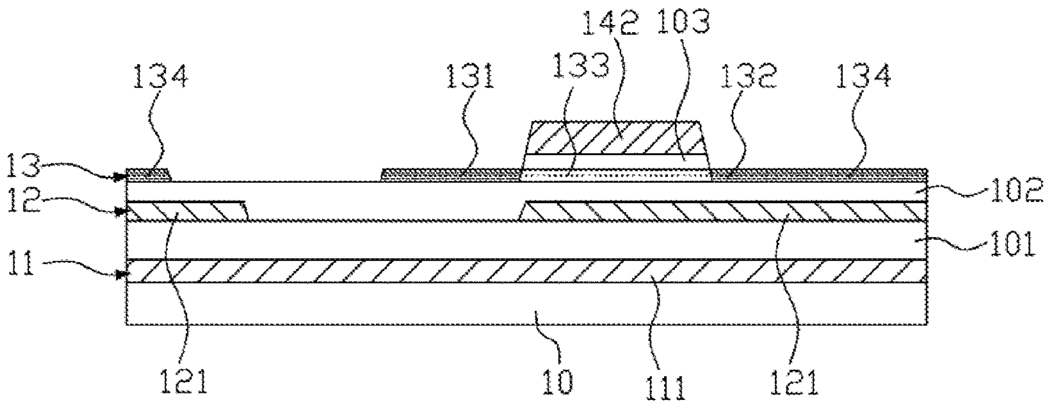
FIGS. 7*a*-7*c* are cross-sectional views when manufacturing the array substrate in the second embodiment of the present application.
Figure 7B:
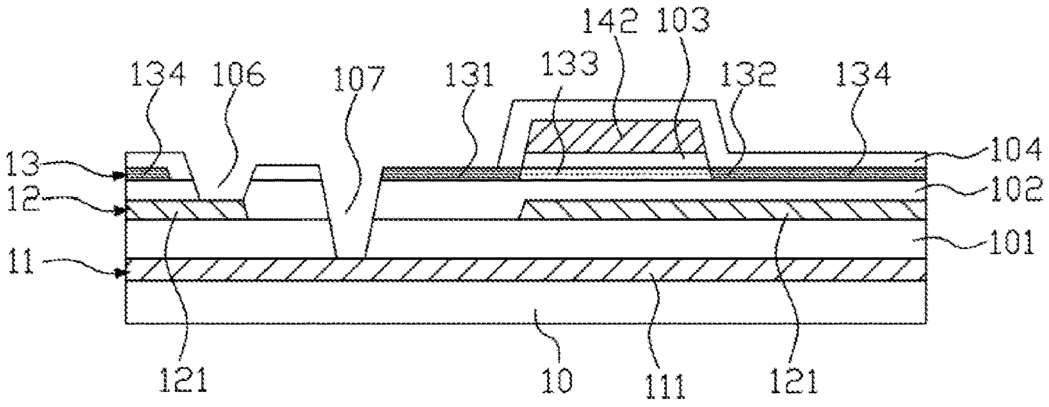
Figure 7C:
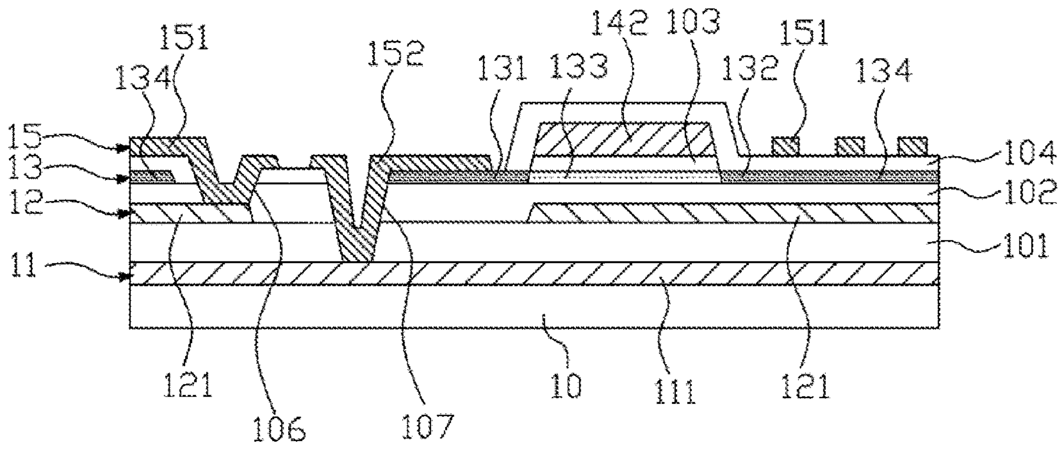

FIG. 6 is a cross-sectional view of the array substrate in the second embodiment of the present application. FIGS. 7*a*-7*c* are cross-sectional views when manufacturing the array substrate in the second embodiment of the present application. As shown in FIGS. 6 to 7*c*, the array substrate provided in the second embodiment of the present application is basically the same as that in the first embodiment (FIGS. 1 to 5*f*). The difference is that, in this embodiment, the touch metal layer 12 includes the touch line 121, but does not include the first connecting block 122. Therefore, the source 131 is electrically connected with the data line 111 only through the second connecting block 152.

This embodiment further provides a manufacturing method of the array substrate. The manufacturing method is basically the same as that in the first embodiment (FIGS. 1 to 5*f*). The difference is that, in this embodiment, as shown in FIG. 7*a*, a first insulating layer 101 covering the data line 111 is formed on the first metal layer 11. At this time, the first insulating layer 101 is not etched, that is, the first contact hole 105 is not formed in the first insulating layer 101 at the position corresponding to the data line 111.

As shown in FIG. 7*a*, a touch metal layer 12 is formed on the first insulating layer 101, and the touch metal layer 12 is etched, such that the touch metal layer 12 is patterned to form a touch line 121. In this embodiment, the touch metal layer 12 does not need to form the first connecting block 122.

As shown in FIG. 7*b*, a third insulating layer 104 is formed on the second metal layer 14, and the third insulating layer 104, the second insulating layer 102 and the first insulating layer 101 are etched simultaneously, such that a second contact hole 106 corresponding to the position of the touch line 121 is formed through the second insulating layer 102 and the third insulating layer 104, and a third contact hole 107 corresponding to the position of the data line 111 is formed through the third insulating layer 104, the second insulating layer 102 and the first insulating layer 101. The upper surface of the touch line 121 is exposed from the second contact hole 106, and the upper surface of the data line 111 is exposed from the third contact hole 107. In addition, when the third insulating layer 104 is etched, the part of the third insulating layer 104 located directly above the source 131 is also etched to expose the source 131.

As shown in FIG. 7*c*, a transparent conductive layer 15 is formed on the third insulating layer 104. The transparent conductive layer 15 is etched, such that the transparent conductive layer 15 is patterned to form a plurality of mutually insulated common electrode blocks 151 and a second connecting block 152 corresponding to the data line 111. The second connecting block 152 is filled into the third contact hole 107, such that the source 131 is electrically connected with the data line 111 through the second connecting block 152.

Compared with the first embodiment, in this embodiment, when forming the first insulating layer 101, the first insulating layer 101 is not etched at first, and the touch metal layer 12 does not need to form the first connecting block 122, but after the third insulating layer 104 is formed, the third insulating layer 104, the second insulating layer 102 and the first insulating layer 101 are etched simultaneously by using a mask, such that the touch line 121 and the data line 111 are exposed respectively, thereby reducing the mask process of etching the first insulating layer 101 to form the first contact hole 105, and further simplifying the manufacturing process.

It should be understood by those skilled in the art that the remaining structures and working principles of this embodiment are the same as those of the first embodiment, and are not repeated here.

Third Embodiment

Figure 8:
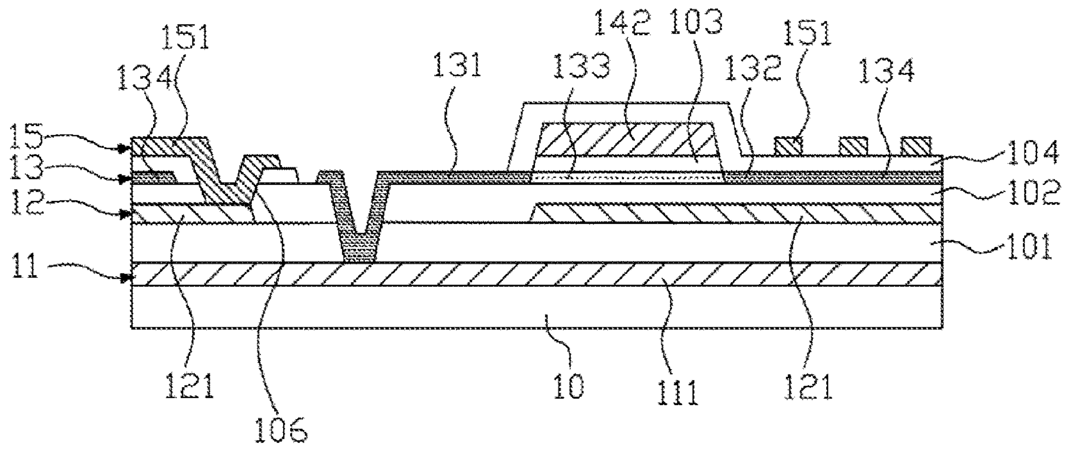

FIG. 8 is a cross-sectional view of the array substrate in the third embodiment of the present application. As shown in FIG. 8, the array substrate provided in the third embodiment of the present application is basically the same as the array substrate in the first embodiment (FIGS. 1 to 5*f*) or the second embodiment (FIGS. 6 to 7*c*). The difference is that, in this embodiment, the source 131 directly contacts the data line 111 to achieve conductive connection, that is, the touch metal layer 12 does not need to form the first connecting block 122, and the transparent conductive layer 15 does not need to form the second connecting block 152.

This embodiment further provides a manufacturing method of the array substrate. The manufacturing method is basically the same as that in the first embodiment (FIGS. 1 to 5*f*) or the second embodiment (FIGS. 6 to 7*c*). The difference is that, in this embodiment, a first insulating layer 101 covering the data line 111 is formed on the first metal layer 11. At this time, the first insulating layer 101 is not etched, that is, the first contact hole 105 is not formed in the first insulating layer 101 at the position corresponding to the data line 111.

A touch metal layer 12 is formed on the first insulating layer 101, and the touch metal layer 12 is etched, such that the touch metal layer 12 is patterned to form a touch line 121. In this embodiment, the touch metal layer 12 does not need to form the first connecting block 122.

A second insulating layer 102 is formed on the touch metal layer 12. The second insulating layer 102 and the first insulating layer 101 are etched simultaneously to form a first contact hole 105 through the second insulating layer 102 and the first insulating layer 101, such that the data line 111 is exposed from the first contact hole 105.

A metal oxide semiconductor layer 13 is formed on the second insulating layer 102. The metal oxide semiconductor layer 13 is etched, such that the metal oxide semiconductor layer 13 is patterned to form a source 131, a drain 132, an active layer 133, and a pixel electrode 134. The source 131 is filled in the first contact hole 105 and directly contacts the data line 111.

A third insulating layer 104 is formed on the second metal layer 14. The third insulating layer 104 and the second insulating layer 102 are etched simultaneously, such that a second contact hole 106 corresponding to the touch line 121 is formed through the third insulating layer 104 and the second insulating layer 102, and the upper surface of the touch line 121 is exposed from the second contact hole 106.

A transparent conductive layer 15 is formed on the third insulating layer 104. The transparent conductive layer 15 is etched, such that the transparent conductive layer 15 is patterned to form a plurality of mutually insulated common electrode blocks 151. Each common electrode block 151 contacts the corresponding touch line 121 through the second contact hole 106. In this embodiment, the transparent conductive layer 15 does not need to form the second connecting block 152.

In this embodiment, when forming the first insulating layer 101, the first insulating layer 101 is not etched at first, and the touch metal layer 12 does not need to form the first connecting block 122, and the transparent conductive layer 15 does not need to form the second connecting block 152, but after the second insulating layer 102 is formed, the second insulating layer 102 and the first insulating layer 101 are etched simultaneously by using a mask to expose the data line 111. Thus, after the metal oxide semiconductor layer 13 is formed, the source 131 can directly contact the data line 111, thereby avoiding setting the first connecting block 122 and the second connecting block 152 between the source 131 and the data line 111, so as to reduce the probability of poor contact.

It should be understood by those skilled in the art that the remaining structures and working principles of this embodiment are the same as those of the first embodiment or the second embodiment, and are not repeated here.

Fourth Embodiment

Figure 9:
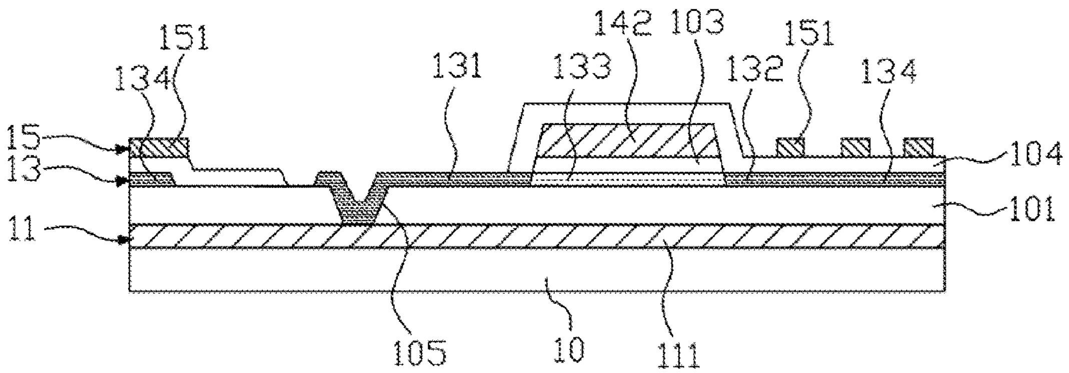

FIG. 9 is a cross-sectional view of the array substrate in the fourth embodiment of the present application. As shown in FIG. 9, the array substrate and its manufacturing method provided in the fourth embodiment of the present application are basically the same as those in the third embodiment (FIG. 8). The difference is that, in this embodiment, the array substrate is not provided with a touch metal layer 12, that is, the array substrate is not provided with the touch line 121 and the first connecting block 122. The second insulating layer 102 does not need to be set on the array substrate. Thus, the common electrode blocks 151 do not need to be insulated from each other, but are connected to each other to form an integral common electrode for being applied with a common voltage signal, that is, the common electrode does not need to be multiplexed as a touch electrode.

In this embodiment, there is no integrated touch function on the array substrate, and the touch function can be set on another substrate, such as the color film substrate 20 (FIG. 12), or an external touch panel is used.

In this embodiment, the touch metal layer 12 does not need to be set on the array substrate, thus greatly reducing the manufacturing process of the array substrate.

It should be understood by those skilled in the art that the rest of the structures and working principles of this embodiment are the same as those of the third embodiment, and are not repeated here.

In addition, it should be noted that the array substrate in the first embodiment (FIG. 1 to FIG. 5*f*) or the second embodiment (FIG. 6 to FIG. 7*c*) described above can also refer to this embodiment, that is, the touch metal layer 12 and the second insulating layer 102 are not set on the array substrate, which will not be further described here.

Fifth Embodiment

Figure 10:
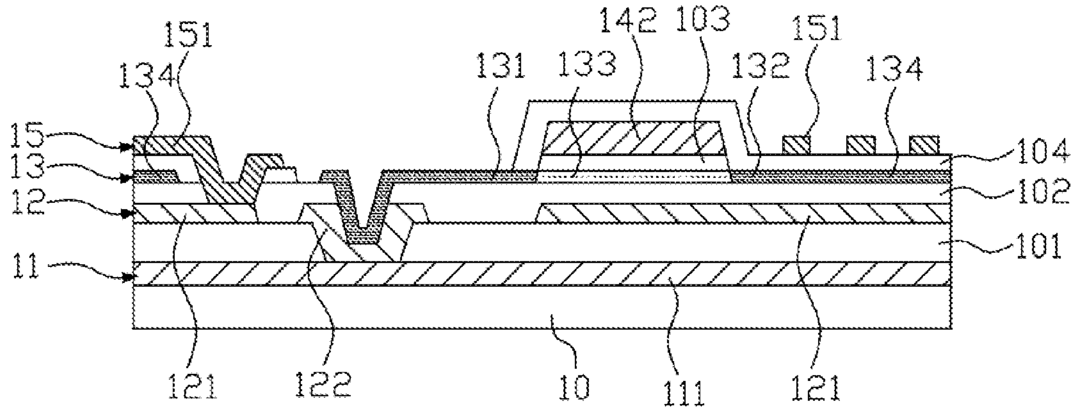

FIG. 10 is a cross-sectional view of the array substrate in the fifth embodiment of the present application. As shown in FIG. 10, the array substrate and its manufacturing method provided in the fifth embodiment of the present application are basically the same as those in the first embodiment (FIGS. 1 to 5*f*). The difference is that, in this embodiment, the transparent conductive layer 15 includes a plurality of common electrode blocks 151, but does not include the second connecting block 152. Therefore, the source 131 is electrically connected with the data line 111 only through the first connecting block 122.

The manufacturing method in this embodiment is basically the same as that in the first embodiment. The difference is that after the touch metal layer 12 is covered with the second insulating layer 102, the second insulating layer 102 is etched to form a contact hole, then a metal oxide semiconductor layer 13 is formed on the second insulating layer 102, and a part of the metal oxide semiconductor layer 13 connecting with the source 131 covers the contact hole and contacts the first connecting block 122, such that the data line 111 is electrically connected with the source 131 through the first connecting block 122. In addition, when etching the transparent conductive layer 15, it is not necessary to form the second connecting block 152.

It should be understood by those skilled in the art that the remaining structures and working principles of this embodiment are the same as those of the first embodiment, and are not repeated here.

Sixth Embodiment

Figure 11:
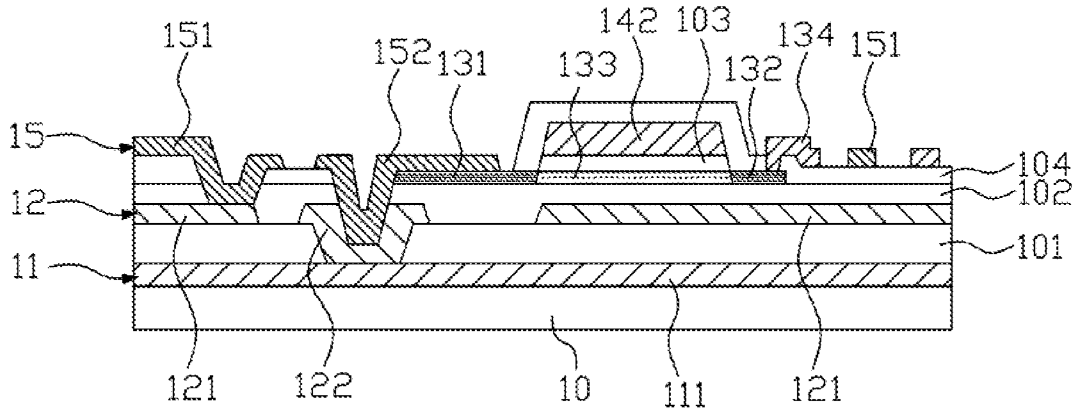
Figure 12:
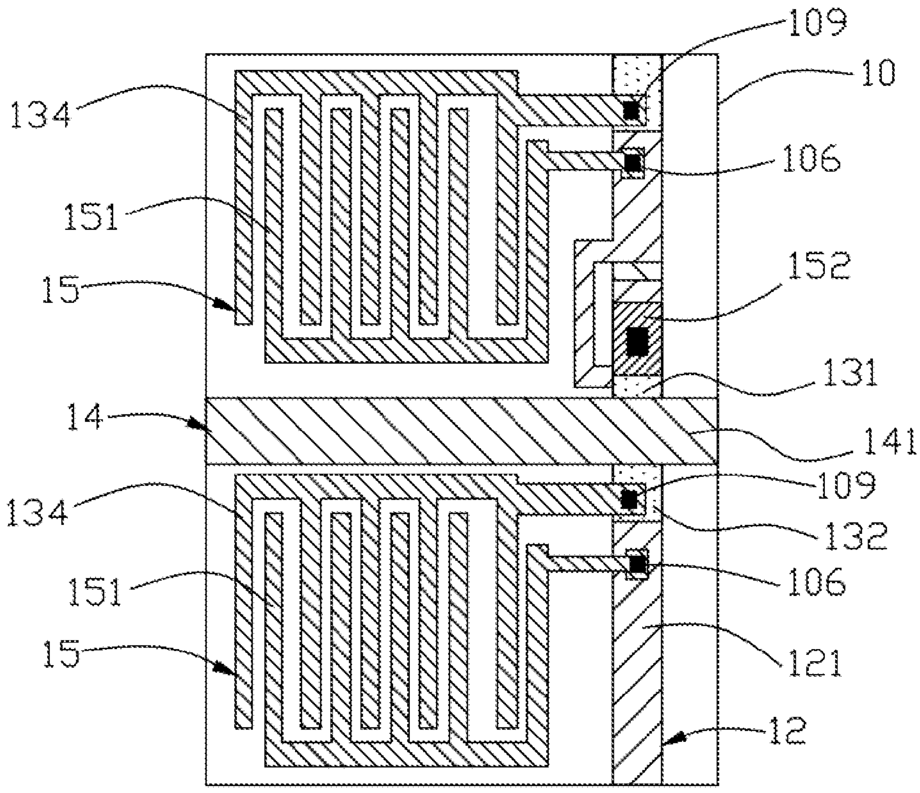

FIG. 11 is a cross-sectional view of the array substrate in the sixth embodiment of the present application, and FIG. 12 is a plan view partially showing the array substrate in the sixth embodiment of the present application. As shown in FIGS. 11 to 12, the array substrate and its manufacturing method provided in the sixth embodiment of the present application are basically the same as those in the first embodiment (FIGS. 1 to 5*f*). The difference is that, in this embodiment, after a metal oxide semiconducting layer 13 is formed on the second insulating layer 102, when the metal oxide semiconductor layer 13 is etched, the metal oxide semiconductor layer 13 is patterned to form a source 131, a drain 132 and an active layer 133, but it is not necessary to form the pixel electrode 134.

A transparent conductive layer 15 is formed on the third insulating layer 104. When the transparent conductive layer 15 is etched, the transparent conductive layer 15 is patterned to form a plurality of mutually insulated common electrode blocks 151 and a plurality of mutually insulated pixel electrodes 134. Each common electrode block 151 correspondingly covers a pixel unit, and each common electrode block 151 contacts the corresponding touch line 121 through the second contact hole 106. A fourth contact hole 109 is formed in the third insulating layer 104 at the position corresponding to the drain 132. Each pixel electrode 134 contacts the corresponding drain 132 through the fourth contact hole 109. In this embodiment, both the common electrode block 151 and the pixel electrode 134 are of comb-like structures that are inserted and matched with each other to form an In-Plane switching (IPS) mode of display.

It should be understood by those skilled in the art that the remaining structures and working principles of this embodiment are the same as those of the first embodiment, and are not repeated here.

Figure 13:
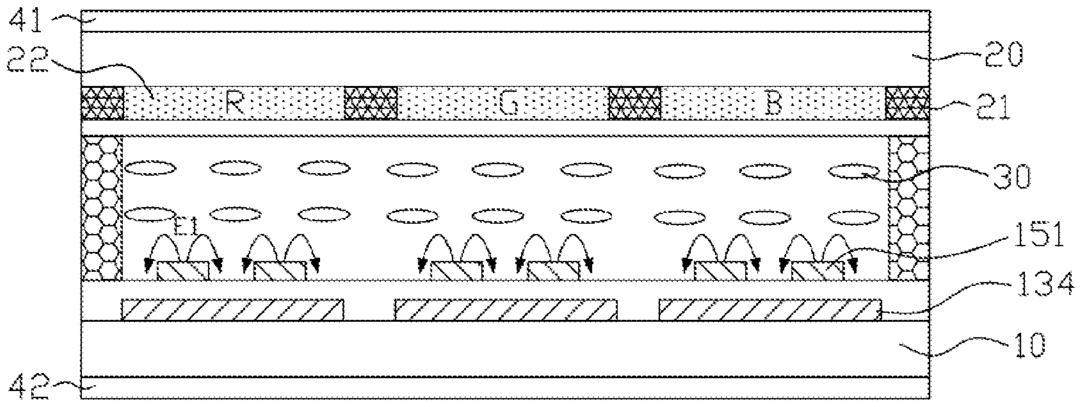

FIG. 13 is a cross-sectional view of the display panel in the present application. As shown in FIG. 13, the present application further provides a display panel, which includes the above array substrate, an opposite substrate 20 disposed opposite to the array substrate, and a liquid crystal layer 30 disposed between the array substrate and the opposite substrate 20. The opposite substrate 20 is provided with an upper polarizer 41, and the array substrate is provided with a lower polarizer 42. The light transmission axis of the upper polarizer 41 is perpendicular to the light transmission axis of the lower polarizer 42. Specifically, the liquid crystal molecules in the liquid crystal layer 30 are positive liquid crystal molecules (that is, liquid crystal molecules with positive dielectric anisotropy). In the initial state, the positive liquid crystal molecules are in a lying posture, and the alignment direction of the positive liquid crystal molecules adjacent to the opposite substrate 20 is parallel to the alignment direction of the positive liquid crystal molecules 131 adjacent to the array substrate. It can be understood that the array substrate and the opposite substrate 20 are further provided with an alignment layer on the inner side facing towards the liquid crystal layer 30, so as to align the positive liquid crystal molecules in the liquid crystal layer 30.

In this embodiment, the opposite substrate 20 is a color film substrate. The opposite substrate 20 is provided with a black matrix 21 and a plurality of color resistor layers 22. The black matrix 21 is aligned with the scan line 141, the data line 111, the thin film transistors and the peripheral non-display area. The black matrix 21 separates the plurality of color resistor layers 22 from each other. The color resistor layers 22 include resist materials of three colors, i.e., red (R), green (G) and blue (B), so as to form sub-pixels of red (R), green (G), and blue (B) correspondingly.

In this description, the directional terms such as "up", "down", "left", "right", "front" and "back" are defined by the positions of the structures in the drawings and the positions between the structures, and are only for clearly and conveniently expressing technical solutions. It should be understood that the use of the directional terms should not limit the scope of protection claimed in this application. It should also be understood that the terms "first" and "second", etc. used herein are only used to distinguish elements, and are not used to limit the number and order.

The above descriptions are only preferred embodiments of the present application, and do not limit the present application in any form. Although the present application has been disclosed above with preferred embodiments, it is not intended to limit the present application. The persons skilled in the art may make some changes or modifications by using the technical content disclosed above, and if they do not depart from the technical content of the present application, any simple modifications, equivalent changes and modifications made to the above embodiments still fall within the protection scope of the technical solution of the present application.

INDUSTRIAL APPLICABILITY

By setting the active layer between the gate and the data line, and the projection of the active layer on the substrate coincides with the overlapping area of the projection of the scan line and the projection of the data line on the substrate, the gate and the data line can respectively shield the external ambient light and the backlight for the active layer, so as to avoid the characteristics degradation of the TFT device caused by the active layer being illuminated, and simplify the manufacturing process due to no need to set an additional light shielding layer. Moreover, the source, the drain and the active layer are all made of metal oxide semiconductor layer, such that the overlapping area between the gate and the source/drain is small, and the parasitic capacitance is reduced.

What is claimed is:

1. An array substrate, comprising:

a substrate;

a first metal layer disposed on an upper surface of the substrate, wherein the first metal layer comprises a data line;

a first insulating layer disposed on an upper surface of the first metal layer, wherein the first insulating layer covers the data line;

a metal oxide semiconductor layer disposed above the first insulating layer, wherein the metal oxide semiconductor layer comprises a source and a drain which are conductors and an active layer which is a semiconductor, the drain and the source are connected through the active layer, the source is electrically connected with the data line;

a gate insulating layer disposed on the metal oxide semiconductor layer and a second metal layer disposed on the gate insulating layer, wherein the second metal layer comprises a scan line and a gate electrically connected with the scan line, a projection of the active layer on the substrate overlaps with a projection of an overlapping area between the scan line and the data line on the substrate, a projection of the gate on the substrate overlaps with the projection of the active layer on the substrate;

a pixel electrode disposed above the first insulating layer, wherein the pixel electrode is electrically connected with the drain;

the array substrate further comprises a third insulating layer disposed on the second metal layer and a transparent conductive layer disposed on the third insulating layer, the third insulating layer covers the scan line and the gate, the transparent conductive layer comprises a plurality of common electrode blocks, and the common electrode block is insulated from the pixel electrode; and the array substrate further comprises a touch metal layer disposed on the first insulating layer, the touch metal layer comprises a touch line, a projection of the touch line on the substrate overlaps with a projection of the data line on the substrate, an extension direction of the touch line is parallel to an extension direction of the data line, and each common electrode block is electrically connected with a corresponding touch line;

wherein the touch metal layer is arranged between the first insulating layer and the metal oxide semiconductor layer, a second insulating layer is arranged between the touch metal layer and the metal oxide semiconductor layer, the touch metal layer further comprises a first connecting block, and the data line is electrically connected with the source through the first connecting block; or the touch metal layer is arranged between the first insulating layer and the metal oxide semiconductor layer, a second insulating layer is arranged between the touch metal layer and the metal oxide semiconductor layer, the touch metal layer further comprises a first connecting block, the transparent conductive layer further comprises a second connecting block, and the data line is electrically connected with the source through the first connecting block and the second connecting block.

2. The array substrate according to claim 1, wherein the transparent conductive layer further comprises the pixel electrode, and both the common electrode block and the pixel electrode are of comb-like structures that are matched with each other; or the metal oxide semiconductor layer is made of transparent metal oxide semiconductor material, the metal oxide semiconductor layer further comprises the pixel electrode which is a conductor, and the pixel electrode is directly connected with the drain.

3. A manufacturing method of an array substrate, the array substrate comprising:

a substrate;

a first metal layer disposed on an upper surface of the substrate, wherein the first metal layer comprises a data line;

a first insulating layer disposed on an upper surface of the first metal layer, wherein the first insulating layer covers the data line;

a metal oxide semiconductor layer disposed above the first insulating layer, wherein the metal oxide semiconductor layer comprises a source and a drain which are conductors and an active layer which is a semiconductor, the drain and the source are connected through the active layer, the source is electrically connected with the data line;

a gate insulating layer disposed on the metal oxide semiconductor layer and a second metal layer disposed on the gate insulating layer, wherein the second metal layer comprises a scan line and a gate electrically connected with the scan line, a projection of the active layer on the substrate overlaps with a projection of an overlapping area between the scan line and the data line on the substrate, a projection of the gate on the substrate overlaps with the projection of the active layer on the substrate;

a pixel electrode disposed above the first insulating layer, wherein the pixel electrode is electrically connected with the drain;

wherein the manufacturing method comprises:

providing a substrate;

forming a first metal layer on the substrate, and etching the first metal layer, such that the first metal layer is patterned to form a data line;

forming a first insulating layer covering the data line on an upper surface of the first metal layer;

forming a metal oxide semiconductor layer above the first insulating layer, and etching the metal oxide semiconductor layer, such that the metal oxide semiconductor layer is patterned to form a source, a drain and an active layer, wherein the source and the drain are electrically connected through the active layer, the source is electrically connected with the data line;

forming a gate insulating layer and a second metal layer on the metal oxide semiconductor layer in sequence, forming a layer of photoresist on an upper surface of the second metal layer, and etching the second metal layer, such that the second metal layer is patterned to form a scan line and a gate electrically connected with the scan line;

using the second metal layer or the photoresist as a shelter to perform a conducting treatment to the metal oxide semiconductor layer, such that the source and the drain of the metal oxide semiconductor layer are made conductive, while the active layer of the metal oxide semiconductor layer remains as a semiconductor, a projection of the active layer on the substrate overlaps with a projection of an overlapping area between the scan line and the data line on the substrate, a projection of the gate on the substrate overlaps with the projection of the active layer on the substrate;

removing the photoresist on the upper surface of the second metal layer;

forming a pixel electrode above the first insulating layer, wherein the pixel electrode is electrically connected with the drain.

4. The manufacturing method of the array substrate according to claim 3, wherein the manufacturing method further comprises:

forming a third insulating layer and a transparent conductive layer on the second metal layer in sequence, and etching the transparent conductive layer, such that the transparent conductive layer is patterned to form a plurality of common electrode blocks, and the common electrode block is insulated from the pixel electrode.

5. The manufacturing method of the array substrate according to claim 4, wherein the transparent conductive layer further comprises a second connecting block, and the data line is electrically connected with the source through the second connecting block.

6. The manufacturing method of the array substrate according to claim 4, wherein the manufacturing method further comprises:

forming a touch metal layer on the first insulating layer, and etching the touch metal layer, such that the touch metal layer is patterned to form a touch line, a projection of the touch line on the substrate overlaps with a projection of the data line on the substrate, an extension direction of the touch line is parallel to an extension direction of the data line, and each common electrode block is electrically connected with a corresponding touch line.

7. The manufacturing method of the array substrate according to claim 6, wherein the touch metal layer is arranged between the first insulating layer and the metal oxide semiconductor layer, a second insulating layer is arranged between the touch metal layer and the metal oxide semiconducting layer, the touch metal layer further comprises a first connecting block, and the data line is electrically connected with the source through the first connecting block.

8. The manufacturing method of the array substrate according to claim 6, wherein the touch metal layer is arranged between the first insulating layer and the metal oxide semiconductor layer, a second insulating layer is arranged between the touch metal layer and the metal oxide semiconducting layer, the touch metal layer further comprises a first connecting block, the transparent conductive layer further comprises a second connecting block, and the data line is electrically connected with the source through the first connecting block and the second connecting block.

9. The manufacturing method of the array substrate according to claim 4, wherein the metal oxide semiconductor layer is made of transparent metal oxide semiconductor material, when the metal oxide semiconductor layer is etched, the metal oxide semiconductor layer further forms the pixel electrode, when performing the conducting treatment to the metal oxide semiconductor layer, the source, the drain and the pixel electrode of the metal oxide semiconductor layer are made conductive; or when the transparent conductive layer is etched, the transparent conductive layer further forms the pixel electrode, and both the common electrode block and the pixel electrode are of comb-like structures that are matched with each other.

* * * * *